(12) United States Patent
Tseng

(10) Patent No.: US 8,919,989 B2
(45) Date of Patent: Dec. 30, 2014

(54) PIEZOELECTRIC GENERATOR

(71) Applicant: Shen-Ko Tseng, Taipei (TW)

(72) Inventor: Shen-Ko Tseng, Taipei (TW)

(*) Notice: Subject to any disclaimer, the term of this patent is extended or adjusted under 35 U.S.C. 154(b) by 163 days.

(21) Appl. No.: 13/668,327

(22) Filed: Nov. 5, 2012

(65) Prior Publication Data
US 2014/0126186 A1    May 8, 2014

(30) Foreign Application Priority Data

Nov. 7, 2011   (CN) .......................... 2011 1 0347235

(51) Int. Cl.
*F21L 13/00*   (2006.01)
*H01L 41/113*  (2006.01)
*H01L 41/04*   (2006.01)

(52) U.S. Cl.
CPC .............. *H01L 41/04* (2013.01); *H01L 41/113* (2013.01)
USPC .......................................... 362/192; 362/103

(58) Field of Classification Search
CPC ... H01L 41/04; H01L 41/113; H01L 41/1134; H01L 41/0926; H01L 41/1873
USPC .......................................... 362/103, 192, 193
See application file for complete search history.

(56) References Cited

U.S. PATENT DOCUMENTS

| | | | | |
|---|---|---|---|---|
| 4,814,661 A * | 3/1989 | Ratzlaff et al. | ............... | 310/328 |
| 5,500,635 A * | 3/1996 | Mott | .......................... | 340/323 R |
| 5,918,502 A * | 7/1999 | Bishop | ............................ | 73/172 |
| 6,012,822 A * | 1/2000 | Robinson | ....................... | 362/103 |
| 6,179,449 B1 * | 1/2001 | Chen | .............................. | 362/293 |
| 8,141,277 B2 * | 3/2012 | Robinson et al. | ............... | 36/137 |
| 8,749,115 B2 * | 6/2014 | Pas et al. | ........................ | 310/314 |
| 2010/0090477 A1 | 4/2010 | Keating et al. | | |

FOREIGN PATENT DOCUMENTS

| | | |
|---|---|---|
| CN | 1835375 A | 9/2006 |
| CN | 101209139 A | 7/2008 |
| CN | 201683127 U | 12/2010 |

\* cited by examiner

*Primary Examiner* — Peggy Neils

(57) ABSTRACT

A piezoelectric generator utilizes to accept a force for generating electric energy and comprises a flexible material and a piezoelectric element set. The piezoelectric element is positioned in the flexible material. The piezoelectric element set is formed by the plurality of piezoelectric elements connected in series, each piezoelectric element comprises a piezoelectric material and a metal sheet. The piezoelectric material has piezoelectricity. When the piezoelectric material suffers a stress, the piezoelectric material will generate a voltage by the deformation. The flexible material has a first elasticity coefficient. The piezoelectric element set has a second elasticity coefficient. The second elasticity coefficient is larger than the first elasticity coefficient. Therefore, the flexible material protects and fixes the piezoelectric element set, the deformation of the piezoelectric element set will not be limited by the flexible material and the voltage generated by the piezoelectric element set will further not be affected thereby.

10 Claims, 4 Drawing Sheets

PIEZOELECTRIC GENERATOR

BACKGROUND OF THE INVENTION

1. Field of the Invention

The present invention relates to a piezoelectric generator, and more particularly, to a piezoelectric generator utilizing to accept a force for generating electric energy.

2. Description of the Prior Art

With the development of industry and economy, lighting devices let people have activities in the night. To promote quality of life, many suppliers constantly develop various lighting devices, such as table lamp, decorative lamp and traffic signal light. Due to the progress of technology, the lighting devices can not only provide traditional illumination function but also decorate houses or streets by colorful light. Therefore, people's life is really close to the lighting devices.

Furthermore, LED device is generally applied to various lighting devices and becomes more and more important. Since LED device is small-volume, long life and resistant to impact, LED device is generally used and catches attention from domestic and foreign suppliers. Because the traditional lighting devices or illuminating devices usually have a plurality of light-emitting units, such as lamp, LED device, or luminescence unit and so on. And the light-emitting units are almost coupled with an electric board and a power supply; wherein the power supply is utilized to provide the light-emitting units with energy for flickering or lighting, so the lighting devices or illuminating devices can work. For many lighting devices or illuminating devices configured in mobile devices, portable power supply is an essential factor. Therefore, portable battery becomes a common power supply for the lighting devices or illuminating devices.

However, battery cannot generate electric energy, so battery must be changed when there is out of electric energy. But the used battery needs to recycle properly or it can be harmful to the environment, and it is bothering for user to recycle or change the battery. In the meantime, people's environmental consciousness rises recently. People can not only pay attention to the sustainable use of resource but also need technology for energy saving or recycling. How to utilize the energy from environment and reduce dependence on particular energy resources is one of people's targets now.

SUMMARY OF THE INVENTION

One objective of the present invention is to provide a piezoelectric generator utilizing to accept a force for generating electric energy, and the piezoelectric generator comprises a flexible material and a piezoelectric element set. The piezoelectric element is positioned in the flexible material. The piezoelectric element set is formed by the plurality of piezoelectric elements connected in series, each piezoelectric element comprises a piezoelectric material and a metal sheet. The piezoelectric material has piezoelectricity. When the piezoelectric material suffers a stress, the piezoelectric material will generate a voltage by the deformation. The flexible material has a first elasticity coefficient. The piezoelectric element set has a second elasticity coefficient. The second elasticity coefficient is larger than the first elasticity coefficient. Therefore, the flexible material can protect and fix the piezoelectric element set, the deformation of the piezoelectric element set will not be limited by the flexible material and the voltage generated by the piezoelectric element set will further not be affected thereby.

Besides, the piezoelectric material is an anode and the metal sheet is a cathode. The piezoelectric material overlaps with the metal sheet alternately, so the plurality of piezoelectric elements can connect in series and form the piezoelectric element set to output higher voltage. On the other hand, to prevent the electric energy from conducting through the flexible material, even having an electric leakage or a short circuit, the flexible material is an insulating material.

Furthermore, the piezoelectric generator of the present invention further comprises a circuit positioned in the flexible material and electrically connected to the piezoelectric element set for rectifying and storing the electric energy from the piezoelectric element set. Besides, to prevent moisture from entering the piezoelectric element set as well as the circuit and causing damage, the flexible material is waterproof and the piezoelectric element set as well as the circuit are totally covered by the flexible material to have waterproof effect. The circuit is capable to electrically connect an electronic device and provide the electronic device with the electric energy to drive it.

According to above description, the present invention utilizes the piezoelectricity of the piezoelectric material. The piezoelectric element set has a deformation and generates electric energy when there is a force on the piezoelectric element set. The circuit can rectify and store the electric energy, and then the circuit transmits the electric energy to the electronic device to drive it. Thus, the electronic device can work without external power supply to save energy.

Another objective of the present invention is to provide an automatically flashing device comprising a sole and a piezoelectric generator. The piezoelectric generator is embedded in the sole and comprises a flexible material and a piezoelectric element set. The flexible material has a first elasticity coefficient. The piezoelectric element set has a second elasticity coefficient and is positioned in the flexible material and formed by a plurality of piezoelectric elements connected in series. Each piezoelectric element comprises a piezoelectric material and a metal sheet. Wherein, the second elasticity coefficient is larger than the first elasticity coefficient. In the meantime, the automatically flashing device further comprises an insole covering the flexible material and an electronic device connected to the piezoelectric element set. When a force is exerted on the insole which then pushes the flexible material and the piezoelectric element set is therefore bended to generate electric energy for the electronic device.

For the automatically flashing device of the present invention, when a user is walking or running, user's weight can act on the piezoelectric element set to drive the electronic device to shine by piezoelectricity. So, the automatically flashing device of the present invention can work without external battery or any other external power supply to save energy.

Many other advantages and features of the present invention will be further understood by the following detailed description and the appended drawings.

BRIEF DESCRIPTION OF THE APPENDED DRAWINGS

DETAILED DESCRIPTION OF THE INVENTION

Figure 1:
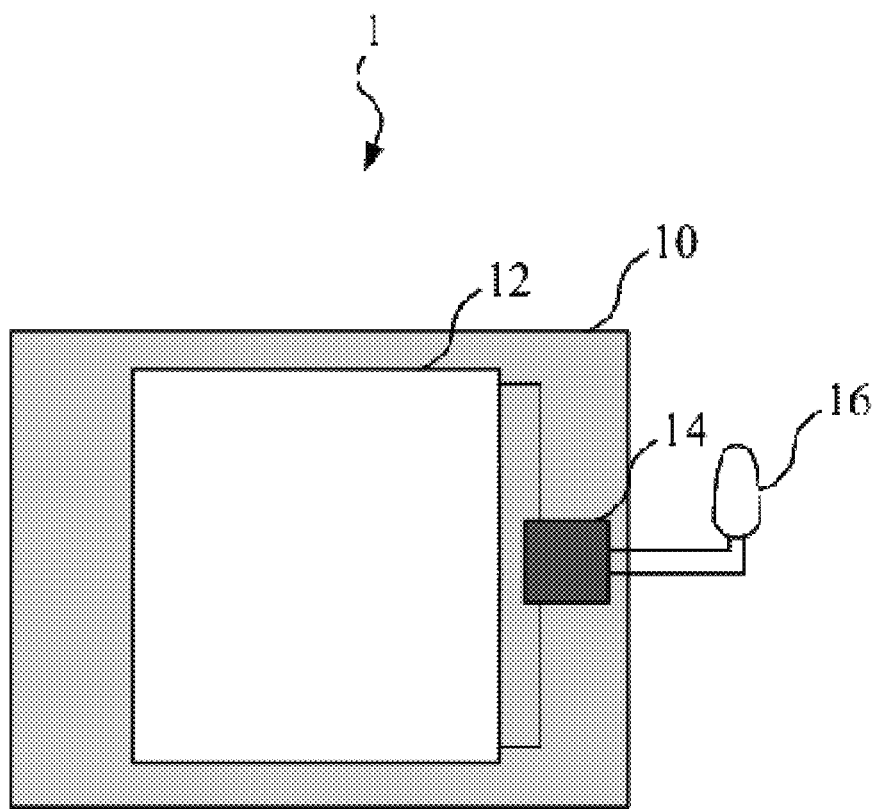
FIG. 1 is a schematic diagram illustrating a piezoelectric generator according to an embodiment of the invention.

Please refer to FIG. 1. FIG. 1 is a schematic diagram illustrating a piezoelectric generator according to an embodiment of the invention. As shown in FIG. 1, the piezoelectric generator 1 utilizes to accept a force for generating electric energy. The piezoelectric generator 1 comprises a flexible material 10 and a piezoelectric element set 12. To prevent the piezoelectric element set 12 from being broken or unstuck by over press, the piezoelectric element set 12 is positioned in the flexible material 10, which is used for protecting and fixing the piezoelectric element set 12.

Figure 2:
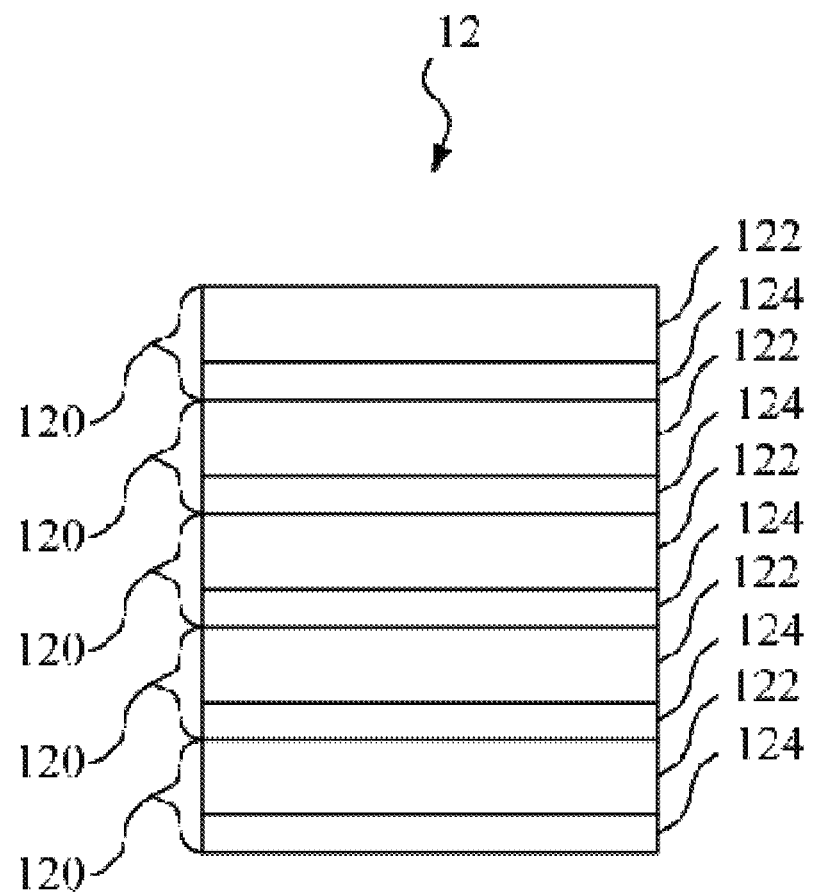
FIG. 2 is a schematic diagram illustrating a piezoelectric element set according to an embodiment of the invention.

Please refer to FIG. 2. FIG. 2 is a schematic diagram illustrating a piezoelectric element set according to an embodiment of the invention. As shown in FIG. 2, the piezoelectric element set 12 is formed by the plurality of piezoelectric elements 120 connected in series. Each piezoelectric element 120 comprises a piezoelectric material 122 and a metal sheet 124. There is a special arrangement between the atoms of the lattice of the piezoelectric material 122, so the material has stress field and electric field coupling effect. When there is a force on the piezoelectric material 122, the distance between the electric dipoles becomes short due to the compression of the material. In order to resist the variation of the distance between the electric dipoles, the piezoelectric material 122 will generate isometric positive and negative charges on the opposing surfaces to maintain the original form of the distance between the electric dipoles, and further to make the piezoelectric material 122 have an electric field. In actual application, the piezoelectric material 122 can be lithium niobate ($LiNbO_3$), tantalum niobate, potassium dihydrogen phosphate (KDP), ammonium dihydrogen phosphate (ADP), lead hydrogen phosphate or other material having piezoelectricity.

In this embodiment, the piezoelectric material 122 is an anode and the metal sheet 124 is a cathode. The piezoelectric material 122 overlaps with the metal sheet 124 to form the piezoelectric element 120, and the piezoelectric material 122 overlaps with the metal sheet 124 alternately, so the plurality of piezoelectric elements 120 can connect in series and form the piezoelectric element set 12. Therefore, because the piezoelectric element set 12 is connected in series by the plurality of piezoelectric elements 120, the piezoelectric element set 12 can output higher voltage than the piezoelectric elements 120.

Besides, the flexible material 10 has a first elasticity coefficient and the piezoelectric element set 12 has a second elasticity coefficient. In this embodiment, because the second elasticity coefficient is larger than the first elasticity coefficient, the deformation of the flexible material 10 will not smaller than the deformation of the piezoelectric element set 12 when they receive an identical force. Therefore, the flexible material 10 can protect and fix the piezoelectric element set 12, but the deformation of the piezoelectric element set 12 as well as the voltage generated by the piezoelectric element set 12 will not be limited by the flexible material 10. Further, in this embodiment, the piezoelectric element set 12 is positioned in the flexible material 10, in order to prevent the electric energy from conducting through the flexible material 10, even having an electric leakage or a short circuit, the flexible material 10 is an insulating material. In actual application, the flexible material 10 can be silica gel, butyl rubber, silicone or other flexible and electric isolating material.

Please refer to FIG. 1 again. The piezoelectric generator 1 of the present invention further comprises the circuit 14 positioned in the flexible material 10 and electrically connected to the piezoelectric element set 12. The circuit 14 has functions of rectifying and storing the electric energy, and comprises one or more diode, capacitor and rechargeable battery. When the piezoelectric element set 12 receives a force and further generates electric energy, the electric energy can be transmitted to the circuit 14 by electrical connection. The circuit 14 can rectify and store the electric energy from the piezoelectric element set 12. Besides, in this embodiment, to prevent the piezoelectric element set 12 from being broken or unstuck by over press, the circuit 14 is positioned in the flexible material, which is used for protecting and fixing the piezoelectric element set 12.

Furthermore, in this embodiment, to prevent moisture from entering the piezoelectric element set 12 as well as the circuit 14 and causing damage, the flexible material 10 is waterproof and the piezoelectric element set 12 as well as the circuit 14 are totally covered by the flexible material 10 to have waterproof effect.

Please refer to FIG. 1 again. As shown in FIG. 1, the circuit 14 is capable to electrically connect an electronic device 16 and provide the electronic device 16 with the electric energy stored in the circuit 14 to drive the electronic device 16 and make it work. Therefore, when there is a force on the piezoelectric element set 12, the piezoelectric element set 12 will have a deformation and generate electric energy. The circuit 14 can rectify and store the electric energy, and then the circuit 14 transmits the electric energy to the electronic device 16 to drive it. Thus, the electronic device 16 can work without external power supply to save energy.

In actual application, the piezoelectric generator 1 of the present invention can be embedded in shoe, cloth, handbag, bag, hats or any other object having space to embed the piezoelectric generator. For example, the piezoelectric generator is embedded in the sole, when a user is walking or running, user's weight can act on the piezoelectric element set to generate electric energy by piezoelectricity.

According to above description, the present invention utilizes the piezoelectricity of the piezoelectric material; the piezoelectric element set has a deformation and generates electric energy when there is a force on the piezoelectric element set. The circuit can rectify and store the electric energy, and then the circuit transmits the electric energy to the electronic device to drive it. Thus, the electronic device can work without external power supply to save energy.

Figure 3A:
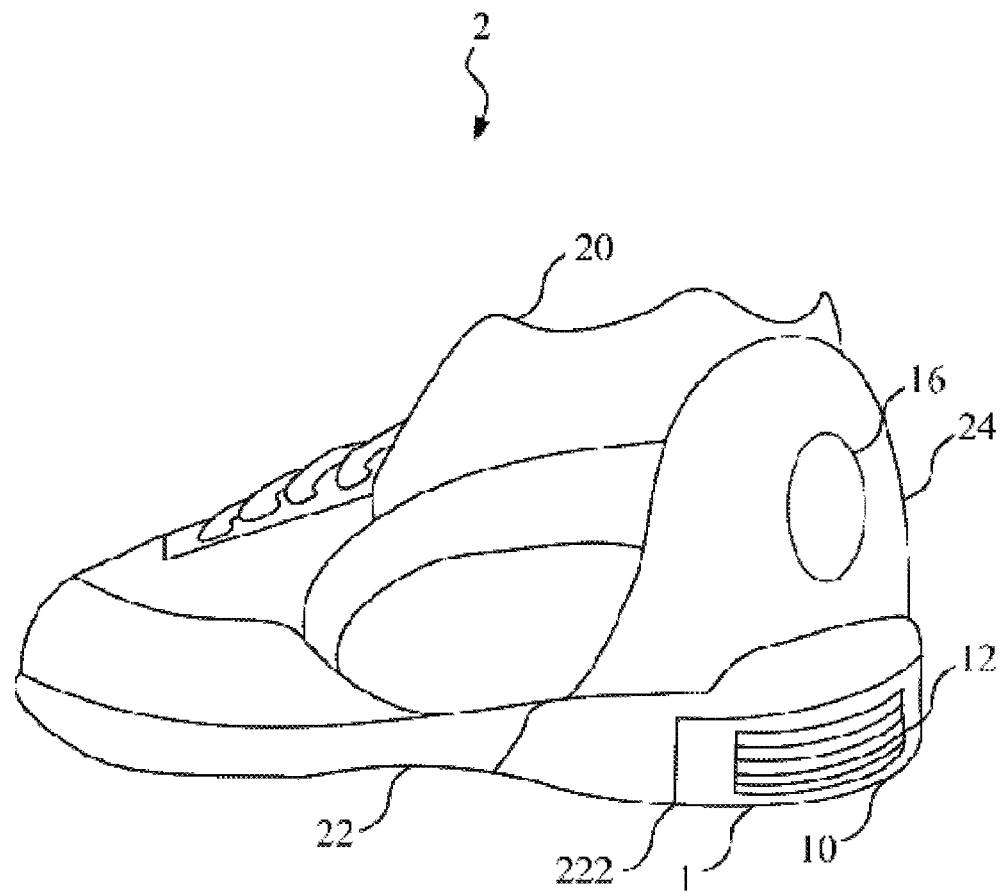
FIG. 3A is a schematic diagram illustrating an automatically flashing device according to an embodiment of the invention.

Please refer to FIG. 3A. FIG. 3A is a schematic diagram illustrating an automatically flashing device according to an embodiment of the invention. As shown in FIG. 3A, the present invention provides an automatically flashing device 2 comprising a shoe 20 with a sole 22 and a piezoelectric generator 1. The piezoelectric generator 1 is embedded in the sole 22 and comprises a flexible material 10. The flexible material 10 has a first elasticity coefficient. The piezoelectric element set 12 has a second elasticity coefficient and is positioned in the flexible material 10 and formed by a plurality of piezoelectric elements connected in series. Each piezoelectric element comprises a piezoelectric material and a metal sheet. Wherein, the second elasticity coefficient is larger than the first elasticity coefficient.

Figure 3B:
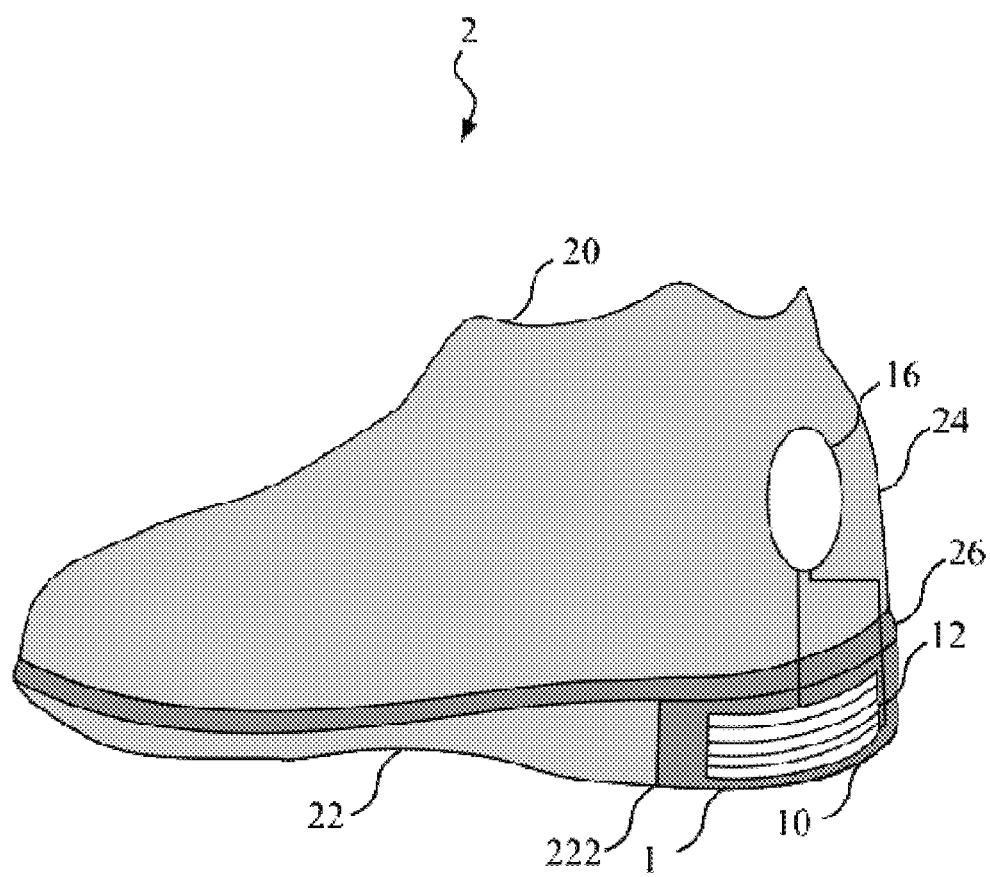
FIG. 3B is a schematic cross-section diagram illustrating an automatically flashing device according to an embodiment of the invention.

Please refer to FIG. 3B. FIG. 3B is a schematic cross-section diagram illustrating an automatically flashing device according to an embodiment of the invention. The automatically flashing device 2 of the invention further comprises an insole 26 covering the flexible material 10 and an electronic device 16 connected to the piezoelectric element set 12. When a force is exerted on the insole 26 which then pushes the flexible material 10 and the piezoelectric element set 12 is therefore bended to generate electric energy for the electronic device 16.

Please refer to FIG. 3A and FIG. 3B. The piezoelectric generator 1 is embedded in the heel 222 of the sole 22. The insole 26 is positioned in the top of the sole 22 and contacts with the flexible material 10 of the piezoelectric generator 1. The electronic device 16 is embedded in the back 24 of the shoe 20. When a user is walking or running, there will be a force act on the sole 22 by stepping on the insole 26, and due to piezoelectricity, the piezoelectric element set 12 generates electric energy to drive the electronic device 16 by pushing the flexible material 10 to press the piezoelectric element set 12. In this embodiment, the electronic device 16 is a LED device. That is to say, when a user is walking or running, the automatically flashing device 2 of the invention can work without external battery or any other external power supply because the piezoelectric generator 1 can generate electric energy to drive the electronic device 16 for shining so as to catch up with the trend of environmental protection and avoid the disturbance for changing batteries. Furthermore, when a user is walking or running at night, the automatically flashing device 2 of the invention can provide strong and safe illumination.

In actual application, the electronic device is not limited to embedded in the back of a shoe, it can be embedded in any other section such as heel, shoe toe, vamp or any other section having space to embed the electronic device.

According to above description, the automatically flashing device of the invention utilizes user's weight and the piezoelectricity of the piezoelectric element set to generate electric energy, further to drive the electronic device to shine, so it can work without external battery or any other external power supply to save energy.

With the example and explanations above, the features and spirits of the invention will be hopefully well described. To be noticed, the present invention is not limited to the embodiment described herein. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A piezoelectric generator for generating electric energy, comprising:
    a flexible material with a first elasticity coefficient; and
    a piezoelectric element set with a second elasticity coefficient, the piezoelectric element set positioned in the flexible material and formed by a plurality of piezoelectric elements connected in series, each piezoelectric element comprising a piezoelectric material and a metal sheet;
    wherein, the second elasticity coefficient is larger than the first elasticity coefficient, the flexible material is waterproof, and the piezoelectric element set is totally covered by the flexible material.

2. The piezoelectric generator of claim 1, further comprising a circuit positioned in the flexible material and electrically connected to the piezoelectric element set for rectifying and storing the electric energy.

3. The piezoelectric generator of claim 2, wherein the circuit is capable to electrically connect an electronic device and provide the electronic device with the electric energy.

4. The piezoelectric generator of claim 3, wherein the electronic device is a LED device.

5. The piezoelectric generator of claim 1, wherein the piezoelectric generator is embedded in the bottom of a shoe.

6. The piezoelectric generator of claim 1, wherein the flexible material is an insulating material.

7. The piezoelectric generator of claim 1, wherein the piezoelectric material is an anode and the metal sheet is a cathode.

8. An automatically flashing device, comprising:
    a shoe with a sole; and
    a piezoelectric generator embedded in the sole, comprising:
        a flexible material with a first elasticity coefficient; and
        a piezoelectric element set with a second elasticity coefficient, the piezoelectric element set positioned in the flexible material and formed by a plurality of piezoelectric elements connected in series, each piezoelectric element comprising a piezoelectric material and a metal sheet;
    wherein, the second elasticity coefficient is larger than the first elasticity coefficient, the flexible material is waterproof, and the piezoelectric element set is totally covered by the flexible material.

9. The automatically flashing device of claim 8, the automatically flashing device further comprising an insole covering the flexible material and an electronic device connected to the piezoelectric element set, wherein when a force is exerted on the insole which then pushes the flexible material and the piezoelectric element set is therefore bended to generate electric energy for the electronic device.

10. The automatically flashing device of claim 8, wherein the electronic device is a LED device.

* * * * *